United States Patent
Ezell

[11] Patent Number: 5,923,159
[45] Date of Patent: Jul. 13, 1999

[54] LOGARITHMIC TAPER RESISTOR WITH ZERO CROSSING CHANGES

[75] Inventor: Richard William Ezell, Carrollton, Tex.

[73] Assignee: Dallas Semiconductor Corp., Dallas, Tex.

[21] Appl. No.: 08/815,503

[22] Filed: Mar. 11, 1997

Related U.S. Application Data

[62] Division of application No. 08/497,485, Jun. 30, 1995, abandoned.

[51] Int. Cl.⁶ .................................................. G05B 24/02
[52] U.S. Cl. .............................................. 323/354; 338/89
[58] Field of Search ............................. 323/354; 338/89, 338/200, 201; 327/536

[56] References Cited

U.S. PATENT DOCUMENTS

| | | | |
|---|---|---|---|
| 4,912,394 | 3/1990 | Sugimoto et al. | 323/354 |
| 4,978,904 | 12/1990 | Fitzpatrick et al. | 323/354 |
| 5,216,355 | 6/1993 | Terada et al. | 323/354 |
| 5,218,225 | 6/1993 | Zanders | 257/538 |
| 5,339,021 | 8/1994 | Thomson | 323/354 |
| 5,408,205 | 4/1995 | Blacka | 323/354 |

*Primary Examiner*—Stuart N. Hecker
*Attorney, Agent, or Firm*—Jenkens & Gilchrist, P.C.

[57] ABSTRACT

A digital potentiometer capable of being connected directly to an electronic switch is disclosed. The digital potentiometer for example may utilize a 64 step resistor array, which would then have 64 steps. Each of the steps have precise values so as to accurately attenuate a signal in logarithmic steps. The logarithmic resistor is connected to a gate device which in turn has a voltage source connected to it designed to provide the threshold or turn-on voltage for the device for each of the 64 steps and wiper points of the resistor array.

10 Claims, 2 Drawing Sheets

LOGARITHMIC TAPER RESISTOR WITH ZERO CROSSING CHANGES

This application is a division of application Ser. No. 08/497,485 filed Jun. 30, 1995, now abandoned.

BACKGROUND OF THE INVENTION

1. Technical Field of the Invention

The present invention relates generally to circuits which produce resistance or voltage potential and, more particularly, to integrated circuits which provide a selectable resistance value or voltage potential between two external terminals thereof.

2. Description of Related Art

Traditional potentiometers are mechanical devices whose resistance varies according to a selected physical position of a wiper, which can produce selected electrical potentials. Typically, wiper location is controlled by rotating or sliding the wiper to the desired position. The increased use of integrated circuits and other semiconductor devices includes efforts to develop solid state potentiometers. For example, Xicor's x9MME, discussed in U.S. Pat. No. 5,243,535, is a resistor array composed of 99 resistive elements wherein wiper position is digitally controllable. Another example is provided in Banezhad and Gregorian, "A Programmable Gain/Loss Circuit," 22 *IEEE Journal of Solid-State Circuits* 1082 (1987), wherein a programmable circuit is disclosed which has gain/loss values ranging from −25.5 dB to +25.5 dB in 0.1 dB increments.

One notable aspect and potential shortcoming of the design of prior art potentiometers is that they utilize conventional integrated circuit manufacturing techniques. This method has several problems which will be apparent from the discussion below. With respect to resistor arrays, it is known that resistance matching between two discrete devices is best accomplished, at the design stage, by designing and building cells of resistors having resistors with equal values and equal numbers of resistors. For example, Maher, et al., U.S. Pat. No. 4,514,703, discloses a resistor chain or attenuator wherein the resistors are substantially similar. In order to obtain a target resistance the interconnections between cells are varied to create the target resistance.

Birkner, U.S. Pat. No. 4,338,195 addresses the precision problem of semiconductor devices by using a programmable resistor array, through electrical fusion, to provide a specified resistance. Birkner does not, however, address the problems of providing precise resistive steps in the digital potentiometer or even recognize the problem of imprecise values of resistance being provided.

A desired resistance of a resistance cell of a digital potentiometer of the prior art, within acceptable tolerances, is only obtained through random good fortune, especially for lower values of resistance. This is especially true when conventional IC fabrication techniques are used. Ordinarily, the resulting resistance is only within a variable tolerance range of the desired resistance. For example, in prior art devices a typical resistance tolerance can be in the range of ±15% but match to each other with much tighter tolerances, as high as fractions of a percent. Thus, the traditional design approaches to developing these resistor banks and/or digital potentiometers lend themselves to repetitively yielding high levels of precision only on exactly repeated resistances. However, it is generally known that even the smallest dB steps in attenuators having logarithmic increments do not provide the required resolution to mimic a smoothly changing resistance needed to produce nonlinear steps. Attenuators of this type cause gain distortions that are marginally tolerable at audio frequencies. These distortions however become unsuitable when precise resistances are required, especially at low values of resistance such as on the order of below 100Ω. The prior art, does not, therefore, appear to provide a solution for a digital potentiometer requiring precise, small, logarithmic steps. This is especially problematical in high-end audio equipment that requires precise tolerance and repeatability.

In addition to not providing precise resistance values, digital potentiometers have other short comings. First, most of the prior art devices at their front end, do not have the capability of directly connecting the control to a switch on a panel, for example of a stereo. While mechanical potentiometers are generally mounted directly to a stereo panel, it is common to interface a digital potentiometer to a switch through a microprocessor which may be under software control. Additionally, when a volume increase is selected, digital potentiometers frequently introduce detectable noise into the signal as different wiper points are selected while a given signal is being amplified.

Finally, the circuits or mechanisms used to switch in and out of the wiper points of a digital potentiometer generally consume large amounts of current and thus generate heat and decrease the mean time between failures of a system using such devices. Thus, what is needed is digital potentiometers which may be directly attached to a switch, as a mechanical potentiometer can be so attached, potentiometers which reduce the noise added to a signal during changes in amplification, potentiometer which provide accurate and predictable attenuation in logarithmic increments to account for human hearing sensitivity, and which consume less power to operate and therefore which are more reliable.

SUMMARY OF THE INVENTION

The present invention is directed to a potentiometer with precise increments from one resistor cell to another resistor cell and, more particularly, to a potentiometer having precise logarithmic increments.

As has been previously stated, resistor ladders and digital potentiometers are designed, in the prior art, using constant steps with exactly repeated layouts for purposes of manufacturing predictability and resistance matching. Thus, for example in one prior art device, a 50 kΩ end-to-end resistance version of a digital potentiometer is comprised of 256 constant steps, each step being equal to 195.3 Ω.

The invention herein differs from the prior art in a variety of ways. First, the cells of each step generally have a varying number of resistors. Additionally, the various cells have different series and parallel combinations of those individual resistors. Finally, the lengths and therefore the resistive values of the individual resistors in each step are varied from cell to cell. Thus, in one step, two resistors may be placed in series each having a resistance value of 137.6 Ω while the adjacent step has two resistors in series having a value of 122.6 Ω each. Then, the next step may be comprised of one resistor having a value of 218.6 Ω. As lower resistance values are desired, subsequent steps may have two resistors in parallel, each resistor having a value of 138.2 ohms. By varying the individual resistor lengths and resistive values as well as the arrangement of resistors within any given step or cell, it is possible to provide very precise resistive values without the prior art's required post-manufacturing steps of resistor trimming. This provides an advantage of allowing precise logarithmic steps which increase or decrease the attenuation of a signal smoothly and along a desired response curve by way of this invention.

BRIEF DESCRIPTION OF THE DRAWINGS

Other advantages and novel features of the present invention will become apparent from the following detailed description of the invention when considered in conjunction with the accompanying drawings in which.

DETAILED DESCRIPTION OF THE PRESENTLY PREFERRED EXEMPLARY EMBODIMENTS

Figure 1:
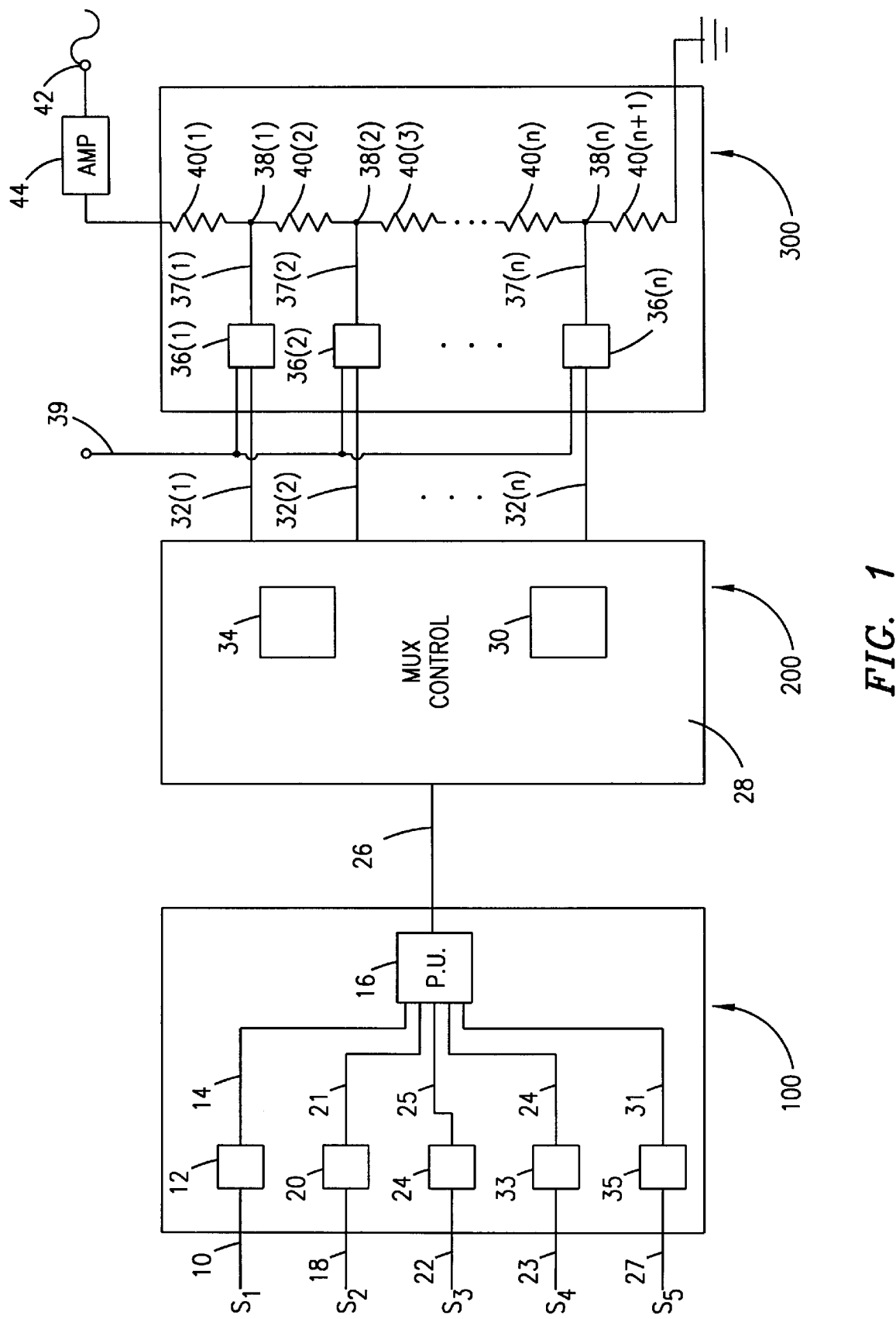
FIG. 1 is a block diagram demonstrating a system overview comprising the invention.

Referring now to FIG. 1 there is shown a block diagram of the system comprising the invention. Depicted in FIG. 1 is a series of blocks all forming a part of the digital potentiometer of this invention. As may be seen, block 100, which contains circuitry adapted for communicating with external switches, is connected to block 200 which contains circuitry for controlling the multiplexers of block 300 which, in turn, interface with the resistor chain of the potentiometer. Thus, a digital potentiometer which is fully capable of being directly connected between external switches and an amplifier to produce an attenuated output signal is provided.

More specifically, still referring to FIG. 1, an external switch $S_1$ is connected by line 10 to a debounce circuit 12 which is within block 100. The debounce circuit 12 is a conventional standard debounce circuit which reads and interprets the open/close state of external switch $S_1$ and thereafter produces a signal over line 14 to a processing unit 16 which reflects the state of the external switch $S_1$. Similarly, a plurality of other switches $S_2 \ldots S_n$, are also connected to a processing unit 16 in a similar manner. As is shown in FIG. 1, a switch $S_2$ is connected over line 18 to a debounce circuit 20 which is in turn connected to the processing unit over line 21. Switch $S_3$ is connected over line 22 to debounce circuit 24 which is in turn connected to processing unit 16 over line 25.

Processing unit 16 then contains a circuit for interpreting the state of the external switches and an order of selection. In accordance with this interpretation of the states, the processing unit 16 sends commands over line 26 to a multiplexer control 28 located in block 200 to activate the multiplexer 200 and to select the resistive value produced by the potentiometer resistor array of block 300. The circuit for interpreting the commands produced by the processing unit 16 may, for example, be digital circuitry, or in the form of a microprocessor under software control, or a combination thereof.

While the logic and circuitry of processing unit 16 will vary widely according to the devices with which it is being interfaced, in one embodiment utilizing the invention herein, the external switches represent push-button switches for a consumer stereo. For example, switch $S_1$ and $S_2$ might represent a volume selection while switches $S_3$ and $S_4$ might represent the balance selection switches, respectively. In this embodiment, processing unit 16 will determine whether switch $S_1$, $S_2$, $S_3$ or $S_4$ is being selected, and if more than one switch $S_1$, $S_2$, $S_3$ or $S_4$ is selected, then, which of the switch was selected first. Accordingly, the processing unit 16 will issue control commands over line 26 to the MUX control circuit 28. In this particular example, the balance may be adjusted by decreasing the volume of the channel which is being de-emphasized in terms of balance. Thus, balance control amounts to specific volume control for the individual channels. Since balance and volume control are all similar in that both entail making volume adjustments to one or more channels, the system must determine which command was received first so that the appropriate volume adjustment commands may be made by the processing unit 16 over line 26 to the multiplexer control device 28 of block 200.

When the multiplexer control 28 of block 300 receives a changed volume level indication over line 26 from processing unit 16, it determines what the appropriate logarithmic resistance should be and what, if any, appropriate change needs to be made. Accordingly, the multiplexer control will activate one of the plurality of lines 32(1) through 32(n) to select the appropriate wiper position of the potentiometer. In one embodiment, the potentiometer will have a resistor array having 64 logarithmic steps. It should be readily apparent to one skilled in the art that a greater or lesser number of logarithmic steps could be employed. For example, an embodiment using 128 logarithmic steps would provide significantly greater precision. Accordingly, there would be 128 multiplexer control lines, namely 32(1) through 32(128).

Once the multiplexer activates a wiper position control line 32(1)–32(n) to provide a signal to select the desired resistance value in the resistor array of the potentiometer, the desired volume or change in volume is achieved if such device is being used with an amplifier. It is worth noting the processing unit 16 has the ability to "step" the resistance values from the original wiper selection to the final wiper selection, over a given time period to produce a gradual increase in the desired volume so as to avoid instantaneous change, if the change called for is sufficient to justify or require such stepping. This may be desired so as to prevent too rapid a change in volume, for example.

When the multiplexer control device 28 activates one of the plurality of lines 32(1)–32(n), the signal activates a charge pump 34 which comprises a buffer or "level shifter" which in turn provides over line 32(n), to a gate device 36(n), a voltage level adapted for activating a gate device 36(1)–36(n) by supplying a threshold operating voltage. This voltage level to drive the gate device is produced by a charge pump, but may also be produced by other means. Thus, the gate device 36(1)–36(n) is activated and provides a connection between that wiper point 38(n) and the output (39). Thus, by way of example, if the multiplexer control device 28 activates line 32(2), then buffer 34(2) provides a threshold voltage over line 35(2) to gate device 36(2) which in turn establishes a wiper connection over line 37(2) between wiper point 38(2) and the output 39. This charge pump producing the threshold voltage to the gate device is discussed in more detail in a related application which is being filed concurrently herewith of Ezell, which is entitled "Charge Pump" and which bears attorney docket number 20661/00402, and which is incorporated by referenced herein. A further improvement is the use of a zero crossing detector to act as a "trigger" for the switch. Such a feature is disclosed in a concurrently filed related application of Ezell, which is entitled "Zero Crossing Detector", U.S. application Ser. No. 08/497,301, and which is also incorporated by reference herein.

Figure 2:
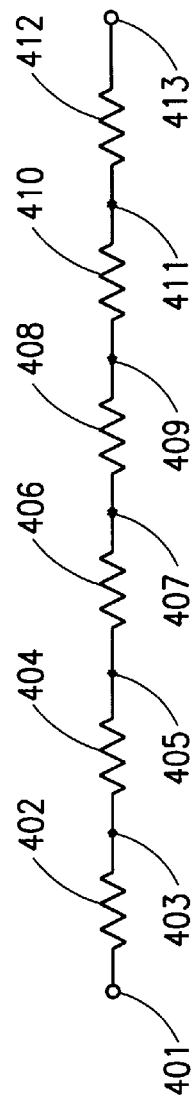
FIG. 2 is a diagram illustrating one embodiment of a resistor chain in the prior art.

Referring now to FIG. 2, a diagram representing a digital attentuator/potentiometer, as is found in the prior art, there is shown a plurality of resistors namely resistors 402, 404, 406, 408, 410, and 412. Therebetween each of the plurality of resistors are wiper points 403, 405, 407, 409, and 411. As may be seen, each set of wiper points has an identical arrangement of resistors. In the arrangement shown in the embodiment of FIG. 2, there is one resistor between each of these sets of wiper points. As may be seen in the device of FIG. 2, the arrangement of resistor(s) between wiper points, or "cells", is identical. Moreover, each of the resistors of FIG. 2 namely, 402, 404, 406, 408, 410, and 412, have substantially identical resistance values. Thus, the incremental steps from wiper point to wiper point will be constant or linear. Moreover, the obtainable precision is limited to the value of the resistance between the wiper points as a result of the similarity in the value of the resistors and the arrangement from wiper point to wiper point.

Figure 3:
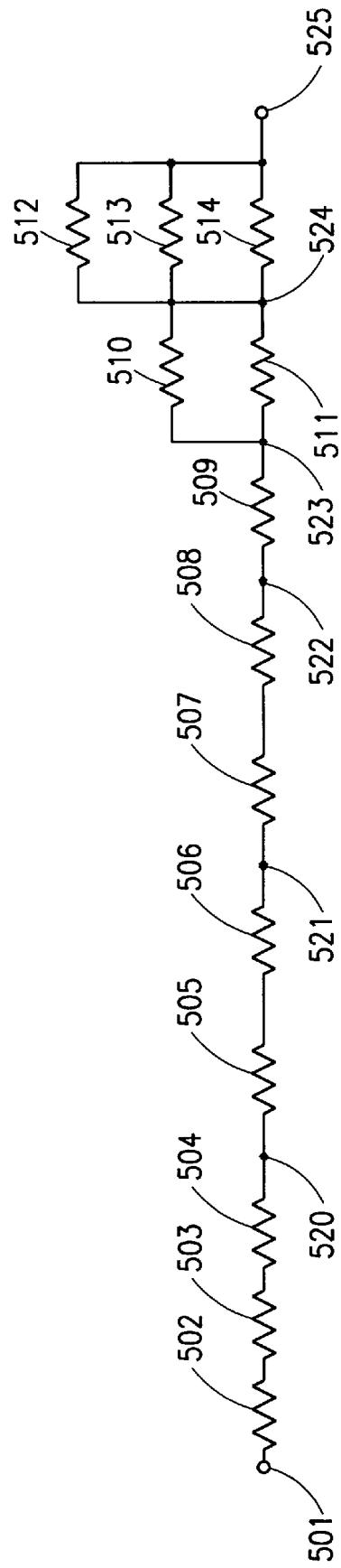
FIG. 3 is a diagram illustrating one embodiment of a resistor chain of the invention herein.

Referring now to FIG. 3 there is shown one embodiment of the invention herein. Examining the wiper points 501, 520, 521, 522, 523, and 524, and the resistors therebetween, it may be seen that the arrangement of resistor varies from one set of wiper points, or from one cell to another. Specifically, the three resistors 502, 503, and 504 are connected in series between input 501 and wiper point 520 while there are only two resistors 505 and 506 between wiper points 520 and 521. Similarly, there are only two resistors in series between wiper points 521 and 522. Therefore it appears that the arrangement between wiper points 520 and 521 is similar to that between 521 and 522. It should be noted that the individual resistors that make up the second set of wiper points will generally have different values than the individual resistors that make up the first set. Specifically resistors 507 and 508 will have different values than 505 and 506. Therefore, as may be seen, the resistance between the various wiper points 501, 520, 521, 522, 523 and 524 is modified not only by changing the arrangement or number of resistors but also by changing the lengths of the individual resistors and therefore their resistances.

Further with respect to FIG. 3, other changes in arrangement also include the method of connection. Specifically, between wiper points 523 and 524, two resistors, namely 510 and 511 are connected in parallel to reduce the total resistance to a value less than either one of the individual resistors. Between wiper points 524 and output 525, three resistors namely 512, 513, and 514, having different resistive values as compared to resistors 510 and 511, are placed in parallel to produce an even lower resistance. Again the total resistance of these parallel arrangements of resistors is also a function of the individual resistor value which is determined, in part by the length chosen for the specific resistors. Within this embodiment, the resistors arranged together within a cell, or two wiper points, have similar resistance values and similar lengths. However, they do not have to be of similar values or lengths.

From one cell to the next, the value of resistance can increase logarithmically in 1 dB increments. Further with, for example, the number of cells as set forth in the above example provide a total of 64 dB of attenuation from end-to-end. Using 128 steps could provide 0.25 dB steps. Further, even though attenuation is discussed herein, it should be understood that this invention can also control or achieve gain using a different amplifier configuration.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A semi-conductor potentiometer which comprises:

a resistor array comprised of a plurality of cells of resistors each having a resistive value wherein the arrangement of resistors and resistive value of the resistors varies from cell to cell;

a plurality of gate devices for selecting a wiper point wherein there exists a wiper point for every cell and there exists a gate device for every wiper point adapted for selecting said wiper point;

a multiplex control device which comprises a zero-crossing detector adapted for triggering potentiometer changes at or near a zero-crossing of a signal being amplified; and an interface device connected to the multiplexer control device adapted for interfacing said multiplex control device directly to an external switch without requiring a special circuit or CPU to provide an interface.

2. In an amplifier for amplifying a signal, a potentiometer comprising:

a resistor array comprised of a plurality of cells of resistors, each of said plurality of cells of resistors having a total resistive value;

a plurality of wiper points for separating each of said plurality of cells of resistors;

means for selecting at least one of said plurality of wiper points;

triggering means for triggering potentiometer changes at or near a zero-crossing of the signal being amplified; and an interface means connected to said triggering means, said interface means for interfacing said triggering means to an external switch.

3. The potentiometer as recited in claim 2, wherein said resistors and said total resistive value of each said plurality of cells of resistors varies from cell to cell.

4. The potentiometer as recited in claim 2, wherein said selecting means includes a plurality of gate devices.

5. The potentiometer as recited in claim 2, wherein said triggering means includes a zero-crossing detector.

6. The potentiometer as recited in claim 2, wherein said triggering means includes a multiplex control device.

7. In a system for amplifying a signal, a potentiometer comprising:

a plurality of cells of resistors, each of said plurality of cells of resistors having a total resistive value;

a plurality of wiper points, wherein each of said plurality of cells of resistors are connected by at least one of said plurality of wiper points;

a plurality of gate devices for selecting at least one of said plurality of wiper points;

a control for triggering potentiometer changes at or near a zero-crossing of the signal being amplified; and an interface connected to the control device.

8. The potentiometer as recited in claim 7, wherein said total resistive value of each of said plurality of cells of resistors varies from cell to cell.

9. The potentiometer as recited in claim 7, wherein said control includes a zero-crossing detector.

10. The potentiometer as recited in claim 7, wherein said interface includes an external switch.

* * * * *

UNITED STATES PATENT AND TRADEMARK OFFICE
CERTIFICATE OF CORRECTION

PATENT NO. : 5,923,159
DATED : July 13, 1999
INVENTOR(S) : Richard William Ezell It is certified that error appears in the above-identified patent and that said Letters Patent is hereby corrected as shown below:

<u>Column 1,</u>
Line 44, replace "4,338,195" with -- 4,862,136 --.

Signed and Sealed this

Twenty-first Day of August, 2001

Attest:

*Nicholas P. Godici*

NICHOLAS P. GODICI
*Attesting Officer*      *Acting Director of the United States Patent and Trademark Office*